US012052936B2

(12) United States Patent
Sadana et al.

(10) Patent No.: US 12,052,936 B2
(45) Date of Patent: Jul. 30, 2024

(54) SUPERCONDUCTOR-SEMICONDUCTOR JOSEPHSON JUNCTION

(71) Applicant: International Business Machines Corporation, Armonk, NY (US)

(72) Inventors: Devendra K. Sadana, Pleasantville, NY (US); Ning Li, White Plains, NY (US); Stephen W. Bedell, Wappingers Falls, NY (US); Sean Hart, Tarrytown, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/148,145

(22) Filed: Dec. 29, 2022

(65) Prior Publication Data
US 2023/0133709 A1    May 4, 2023

Related U.S. Application Data

(62) Division of application No. 16/534,882, filed on Aug. 7, 2019, now Pat. No. 11,581,472.

(51) Int. Cl.
*H10N 60/80* (2023.01)
*G06N 10/00* (2022.01)
*H10N 60/10* (2023.01)

(52) U.S. Cl.
CPC ........... *H10N 60/805* (2023.02); *G06N 10/00* (2019.01); *H10N 60/128* (2023.02)

(58) Field of Classification Search
CPC ..... H10N 60/805; H10N 60/128; G06N 10/00
(Continued)

(56) References Cited

U.S. PATENT DOCUMENTS 5,179,426 A * 1/1993 Iwamatsu ............ H10N 60/128
257/E39.016
5,793,055 A 8/1998 Kastalsky
(Continued)

FOREIGN PATENT DOCUMENTS

WO    2010/028183 A2    3/2010

OTHER PUBLICATIONS

Bai et al., "Gate-Tuned Josephson Effect on the Surface of a Topological Insulator," Nanoscale Research Letters, 2014, vol. 9, No. 515, pp. 1-8.
(Continued)

*Primary Examiner* — Tu-Tu V Ho
(74) *Attorney, Agent, or Firm* — Amin, Turocy & Watson, LLP

(57) ABSTRACT

A gated Josephson junction includes a substrate and a vertical Josephson junction formed on the substrate and extending substantially normal the substrate. The vertical Josephson junction includes a first superconducting layer, a semiconducting layer, and a second superconducting layer. The first superconducting layer, the semiconducting layer, and the second superconducting layer form a stack that is substantially perpendicular to the substrate. The gated Josephson junction includes a gate dielectric layer in contact with the first superconducting layer, the semiconducting layer, and the second superconducting layer at opposing side surfaces of the vertical Josephson junction, and a gate electrically conducting layer in contact with the gate dielectric layer. The gate electrically conducting layer is separated from the vertical Josephson junction by the gate dielectric layer. In operation, a voltage applied to the gate electrically conducting layer modulates a current through the semiconducting layer of the vertical Josephson junction.

8 Claims, 12 Drawing Sheets

(58) Field of Classification Search
USPC .......................................................... 505/193
See application file for complete search history.

(56) References Cited

U.S. PATENT DOCUMENTS

| | | |
|---|---|---|
| 9,755,133 B1 | 9/2017 | Nayfeh et al. |
| 10,177,297 B2 | 1/2019 | Marcus et al. |
| 10,565,515 B2 | 2/2020 | Lampert et al. |
| 2018/0013053 A1 | 1/2018 | Lebby et al. |
| 2018/0219150 A1 | 8/2018 | Lanting et al. |

OTHER PUBLICATIONS

Nichol, John M. "Wiring Up Superconducting Qubits" Physics, 2015, vol. 8, No. 87, 3 pages.
Loubet et al., "Stacked Nanosheet Gate-All-Around Transistor to Enable Scaling Beyond FinFET," IEEE, Symposium on VLSI Technology, 2017, 2 pages.
Notice of Allowance received for U.S. Appl. No. 16/534,882 dated Sep. 27, 2022, 28 pages.

* cited by examiner

SUPERCONDUCTOR-SEMICONDUCTOR JOSEPHSON JUNCTION

BACKGROUND

The present invention relates to Josephson junctions, and more specifically, to a superconductor-semiconductor Josephson junction.

Most qubits currently in use have a fixed frequency. Adjusting the frequency of the qubit may require annealing, an irreversible process. As the number of qubits included in a quantum processor increases, the likelihood of frequency collisions also increases. Thus, there is a need for qubits that can be reversibly tuned.

Further, qubit structures are needed that enable qubits to be formed with higher density. Compact horizontal Josephson junctions have been heretofore unattainable because lithographic techniques place limits on how thin the dielectric layer of the Josephson junction can be formed.

SUMMARY

According to an embodiment of the present invention, a gated Josephson junction includes a substrate and a vertical Josephson junction formed on said substrate and extending substantially normal to a surface of the substrate. The vertical Josephson junction includes a first superconducting layer in contact with said substrate, a semiconducting layer in contact with said first superconducting layer, and a second superconducting layer in contact with said semiconducting layer. Each of said first superconducting layer, said semiconducting layer, and said second superconducting layer form a stack comprising said first and second superconducting layers and said semiconducting layer constituting said vertical Josephson junction, said stack being substantially perpendicular to said surface of said substrate. The gated Josephson junction includes a gate dielectric layer in contact with said first superconducting layer, said semiconducting layer, and said second superconducting layer at opposing side surfaces of said vertical Josephson junction, and a gate electrically conducting layer in contact with said gate dielectric layer, said gate electrically conducting layer being separated from said opposing side surfaces of said vertical Josephson junction by said gate dielectric layer. In operation, a voltage applied to said gate electrically conducting layer modulates a current through said semiconducting layer of said vertical Josephson junction.

According to an embodiment of the present invention, a tunable qubit includes a gated Josephson junction. The gated Josephson junction includes a substrate and a vertical Josephson junction formed on said substrate and extending substantially normal to a surface of the substrate. The vertical Josephson junction includes a first superconducting layer in contact with said substrate, a semiconducting layer in contact with said first superconducting layer, and a second superconducting layer in contact with said semiconducting layer. Each of said first superconducting layer, said semiconducting layer, and said second superconducting layer form a stack comprising said first and second superconducting layers and said semiconductor layer constituting said vertical Josephson junction, said stack being substantially perpendicular to said surface of said substrate. The gated Josephson junction includes a gate dielectric layer in contact with said first superconducting layer, said semiconducting layer, and said second superconducting layer at opposing side surfaces of said vertical Josephson junction, and a gate electrically conducting layer in contact with said gate dielectric layer, said gate electrically conducting layer being separated from said opposing side surfaces of said vertical Josephson junction by said gate dielectric layer. The tunable qubit includes a capacitor coupled to said gated Josephson junction. In operation, a voltage applied to said gate electrically conducting layer modulates a current through said semiconducting layer of said vertical Josephson junction, and, in operation, a voltage applied to said gate electrically conducting layer tunes a frequency of said tunable qubit.

According to an embodiment of the present invention, a method of producing a gated Josephson junction includes forming, on a surface of a substrate, a vertical Josephson junction extending in a vertical direction from a surface of the substrate, said vertical Josephson junction comprising a first superconducting layer in contact with said substrate, a semiconducting layer in contact with said first superconducting layer, and a second superconducting layer in contact with said semiconducting layer. The method includes etching said vertical Josephson junction such that each of said first superconducting layer, said semiconducting layer, and said second superconducting layer are exposed on opposing first and second side surfaces of said vertical Josephson junction, said first and second side surfaces being substantially perpendicular to said surface of said substrate. The method includes forming a gate dielectric layer on said vertical Josephson junction, said gate dielectric layer being in contact with each of said first superconducting layer, said semiconducting layer, and said second superconducting layer at said opposing first and second side surfaces of said vertical Josephson junction. The method includes forming a gate electrically conducting layer on said gate dielectric layer, said gate electrically conducting layer being separated from each of said first superconducting layer, said semiconducting layer, and said second superconducting layer at said opposing first and second side surfaces of said vertical Josephson junction by said gate dielectric layer. In operation, a voltage applied to said gate electrically conducting layer modulates a current through said semiconducting layer of said vertical Josephson junction.

According to an embodiment of the present invention, a horizontal Josephson junction includes a first superconducting layer formed on a surface of a substrate, a second superconducting layer formed on said surface of said substrate, said second superconducting layer being spaced apart from said first superconducting layer, and a dielectric layer formed on said surface of said substrate. The dielectric layer has a first side surface in contact with said first superconducting layer and a second side surface opposing said first side surface and in contact with said second superconducting layer. The first side surface and said second side surface extend substantially perpendicular to said surface of said substrate, and the first and second superconducting layers and said dielectric layer form a horizontal Josephson junction.

According to an embodiment of the present invention, a method of forming a horizontal Josephson junction includes forming a sacrificial layer on a surface of a substrate, said sacrificial layer having a top surface opposite said surface of said substrate, and opposing first and second side surfaces. The method includes forming a dielectric layer, said dielectric layer having a first portion in contact with said top surface of said sacrificial layer, a second portions in contact with one of said opposing first and second side surfaces of said sacrificial layer, and a third portion in contact with said surface of said substrate. The method includes performing vertical etching of said dielectric layer to remove said first portion and said third portion of said dielectric layer. The method includes removing said sacrificial layer, such that said second portion of said dielectric layer remains in contact with said surface of said substrate and extends substantially perpendicular to said surface of said substrate, and forming first and second superconducting layers on said surface of said substrate, said first and second superconducting layers being in contact with opposing sides of said second portion of said dielectric layer. The first and second superconducting layers and said second portion of said dielectric layer form a horizontal Josephson junction.

DETAILED DESCRIPTION

Figure 1:
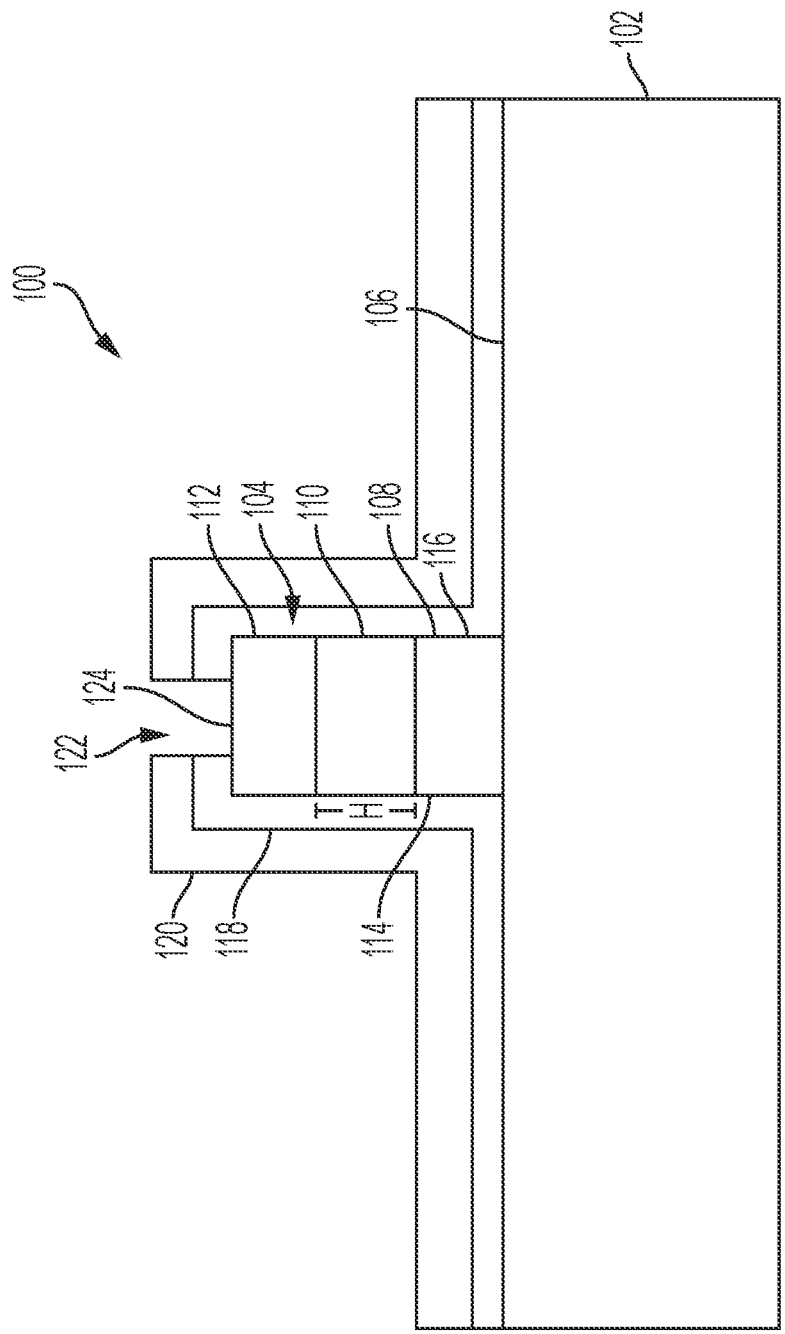
FIG. 1 is a schematic illustration of a gated Josephson junction 100 according to an embodiment of the current invention.

FIG. 1 is a schematic illustration of a gated Josephson junction 100 according to an embodiment of the current invention. The gated Josephson junction 100 includes a substrate 102, and a vertical Josephson junction 104 formed on the substrate 102 and extending substantially normal to a surface 106 of the substrate 102. The vertical Josephson junction 104 includes a first superconducting layer 108 in contact with the substrate 102, a semiconducting layer 110 in contact with the first superconducting layer 108, and a second superconducting layer 112 in contact with the semiconducting layer 110. Each of the first superconducting layer 108, the semiconducting layer 110, and the second superconducting layer 112 form a stack including the first and second superconducting layers 108, 112 and the semiconducting layer 110 constituting the vertical Josephson junction 104, the stack being substantially perpendicular to the surface 106 of the substrate 102.

The gated Josephson junction 100 also includes a gate dielectric layer 118 in contact with the first superconducting layer 108, the semiconducting layer 110, and the second superconducting layer 112 at opposing side surfaces 114, 116 of the vertical Josephson junction 104. The gated Josephson junction 100 also includes a gate electrically conducting layer 120 in contact with the gate dielectric layer 118. The gate electrically conducting layer 120 is separated from the opposing side surfaces 114, 116 of the vertical Josephson junction 104 by the gate dielectric layer 118. In operation, a voltage applied to the gate electrically conducting layer 120 modulates a current through the semiconducting layer 110 of the vertical Josephson junction 104.

According to an embodiment of the current invention, the gate dielectric layer 118 and the gate electrically conducting layer 120 define a trench 122 exposing a portion 124 of the second superconducting layer 112 of the vertical Josephson junction 104. The trench 122 provides a contact via of the vertical Josephson junction 104. According to an embodiment of the current invention, the semiconducting layer 110 of the vertical Josephson junction 104 has a height H defined by a distance between the first superconducting layer 108 and the second superconducting layer 112, wherein the height H is less than 10 nm. The height H may be less than 10 nm, for example, the height H may be equal to or less than 5 nm, 2 nm, or 1 nm.

Figure 2:
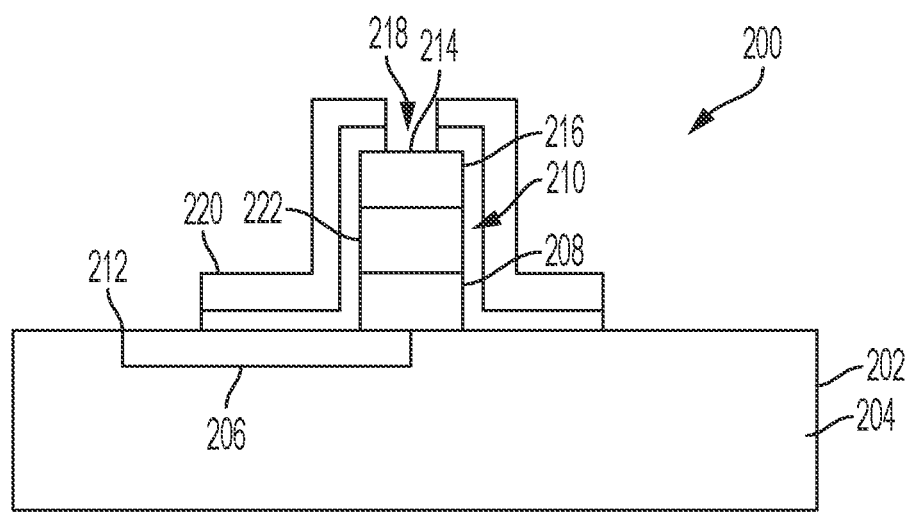
FIG. 2 is a schematic illustration of a gated Josephson junction according to an embodiment of the current invention

FIG. 2 is a schematic illustration of a gated Josephson junction 200 according to an embodiment of the current invention. The substrate 202 comprises a dielectric material 204 and a superconducting via 206 formed in the dielectric material 204. The superconducting via 206 contacts the first superconducting layer 208 of the vertical Josephson junction 210. The gated Josephson junction 200 can be integrated into a circuit by connecting superconducting leads to the superconducting via 206, for example, at the contact point 212, and to the portion 214 of the second superconducting layer 216 of the vertical Josephson junction 210 exposed by the trench 218. An additional lead line can connect to the gate electrically conducting layer 220 to apply a voltage that modulates a current through the semiconducting layer 222 of the vertical Josephson junction 210.

Figure 3:
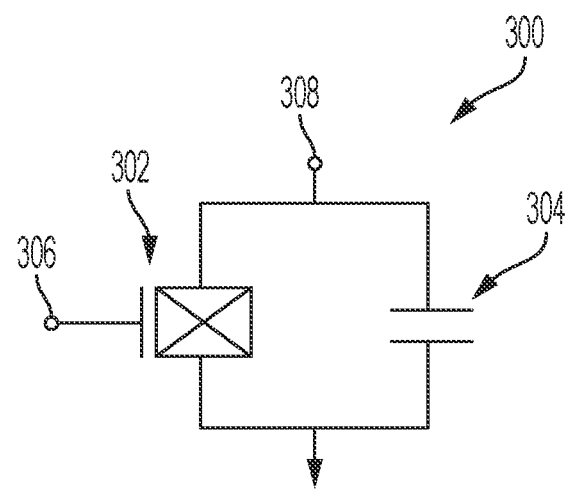
FIG. 3 is a schematic illustration of a tunable qubit according to an embodiment of the current invention.

According to an embodiment of the current invention, the gated Josephson junction is coupled to a capacitor to form a tunable qubit. FIG. 3 is a schematic illustration of a tunable qubit 300 according to an embodiment of the current invention. The tunable qubit includes a gated Josephson junction 302 in parallel with a capacitor 304. The gated Josephson junction 302 may include the features of Josephson junctions illustrated in FIGS. 1 and 2. In operation, a voltage applied to the gate electrically conducting layer, for example, using the port 306, tunes a frequency of the tunable qubit 300. The tunable qubit 300 may be coupled to a bus or transmission line through the port 308.

Figure 4:
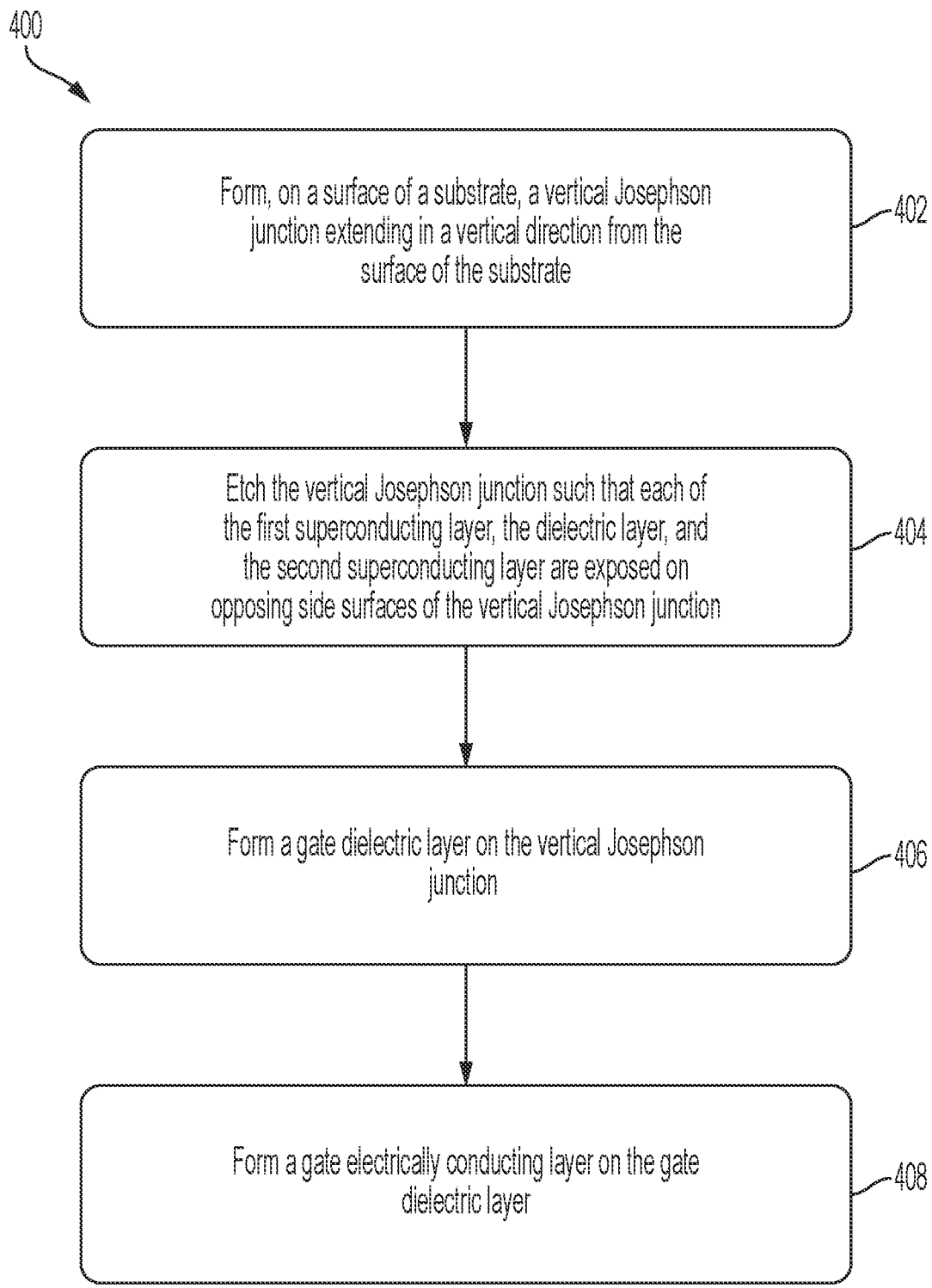
FIG. 4 is a flowchart that illustrates a method of producing a gated Josephson junction according to an embodiment of the current invention.

FIG. 4 is a flowchart that illustrates a method 400 of producing a gated Josephson junction according to an embodiment of the current invention. The method includes forming, on a surface of a substrate, a vertical Josephson junction extending in a vertical direction from the surface of the substrate 400. The vertical Josephson junction is formed to include a first superconducting layer in contact with the substrate, a semiconducting layer in contact with the first superconducting layer, and a second superconducting layer in contact with the semiconducting layer. The method 400 further includes etching the vertical Josephson junction such that each of the first superconducting layer, the semiconducting layer, and the second superconducting layer are exposed on opposing first and second side surfaces of the vertical Josephson junction 404. The etching results in the first and second side surfaces being substantially perpendicular to the surface of the substrate. The method 400 further includes forming a gate dielectric layer on the vertical Josephson junction 406. The gate dielectric layer is formed to be in contact with each of the first superconducting layer, the semiconducting layer, and the second superconducting layer at the opposing first and second side surfaces of the vertical Josephson junction. The method 400 further includes forming a gate electrically conducting layer on the gate dielectric layer 408. The gate electrically conducting layer is formed to be separated from each of the first superconducting layer, the semiconducting layer, and the second superconducting layer at the opposing first and second side surfaces of the vertical Josephson junction by the gate dielectric layer. In operation, a voltage applied to the gate electrically conducting layer modulates a current through the semiconducting layer of the vertical Josephson junction.

According to an embodiment of the invention, forming the semiconducting layer of the vertical Josephson junction comprises forming a semiconducting layer having a height that is less than 10 nm. The semiconducting layer may be formed to have a height that is less than or equal to 5 nm, 2 nm, or 1 nm.

According to an embodiment of the current invention, the method further includes etching a portion of the gate dielectric layer and the gate electrically conducting layer to expose the second superconducting layer, thereby forming a contact via. According to an embodiment of the current invention, the method further includes forming, within a dielectric material of the substrate, a superconducting via, wherein the first superconducting layer of the vertical Josephson junction contacts the superconducting via.

According to an embodiment of the current invention, the method further includes coupling the gated Josephson junction to a capacitor to form a tunable qubit, such as that illustrated in FIG. 3. In operation, a voltage applied to the gate electrically conducting layer tunes a frequency of the tunable qubit.

By replacing the dielectric layer traditionally included in a Josephson junction with a semiconducting layer, and coupling the semiconducting layer to a gate, the current through the Josephson qubit can be easily modulated. Further, when the tunable Josephson junction is coupled to a capacitor to form a qubit, the ability to modulate the current using the gate enables the frequency of the qubit to be reversibly tuned. The gate electrically conducting layer extends along the side of the vertical Josephson junction. This enables a voltage applied to the gate electrically conducting layer to influence the conductivity of the semiconducting layer along the entire height of the semiconducting layer.

FIGS. 5-12 are schematic illustrations of a process that can be used to form a gated Josephson junction according to an embodiment of the current invention. In the description below, reference is made to a single gated Josephson junction, and formation thereof. However, a plurality of gated Josephson junctions may be fabricated at once, as illustrated in the drawings. In FIGS. 5-12, like reference numerals refer to like features, for example, reference numeral 500 in FIGS. 5 and 600 in FIG. 6 both refer to a substrate. The process schematically illustrated in FIGS. 5-12 may employ nanosheet fabrication techniques. For example, each layer that is formed may constitute nanosheet fabrication.

Figure 5:
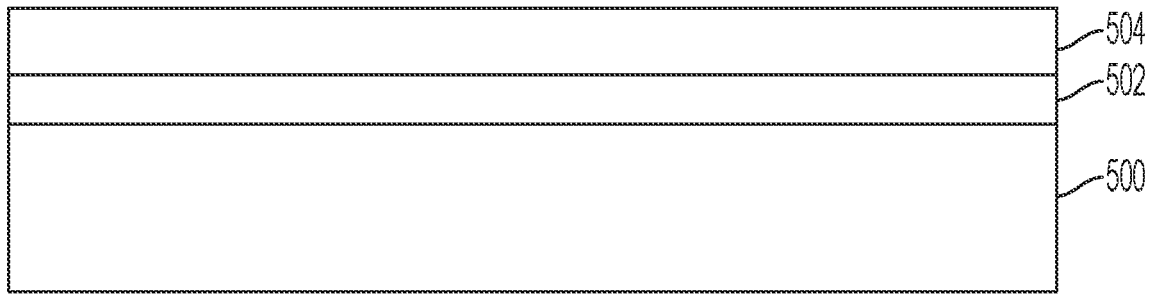
FIGS. 5-12 are schematic illustrations of a process that can be used to form a gated Josephson junction according to an embodiment of the current invention.

To produce a gated Josephson junction according to an embodiment of the current invention, a buffer layer 502 and a channel layer 504 are grown on a substrate 500, as shown in FIG. 5. For example, the substrate 500 may include silicon. A germanium buffer layer may be grown on the silicon, followed by a III-V buffer layer, and then an III-V channel layer. The III-V channel layer may include, for example, indium arsenide. The III-V channel layer may form a semiconducting layer of the gated Josephson junction.

Figure 6:
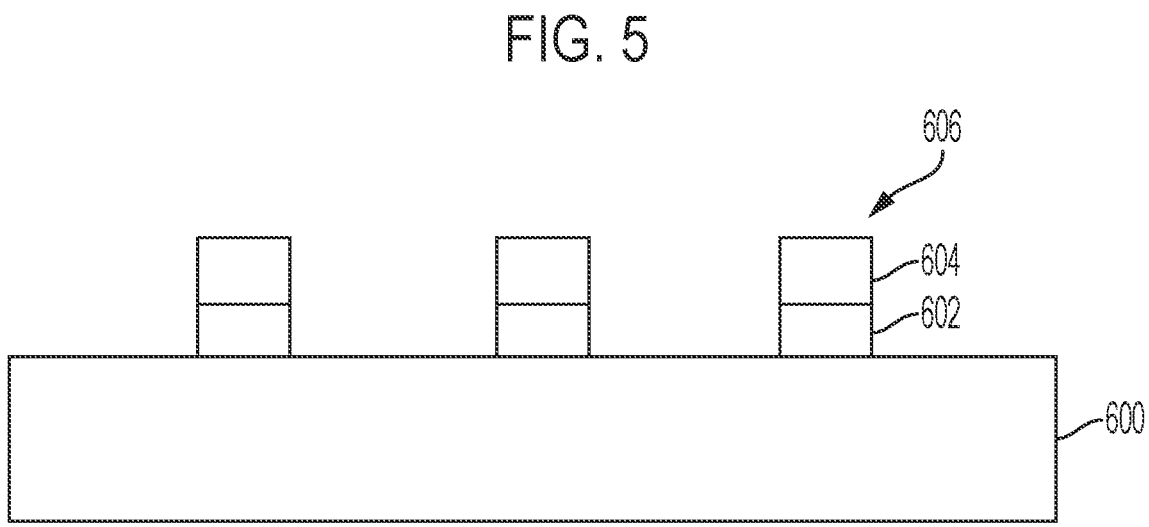
Figure 7:
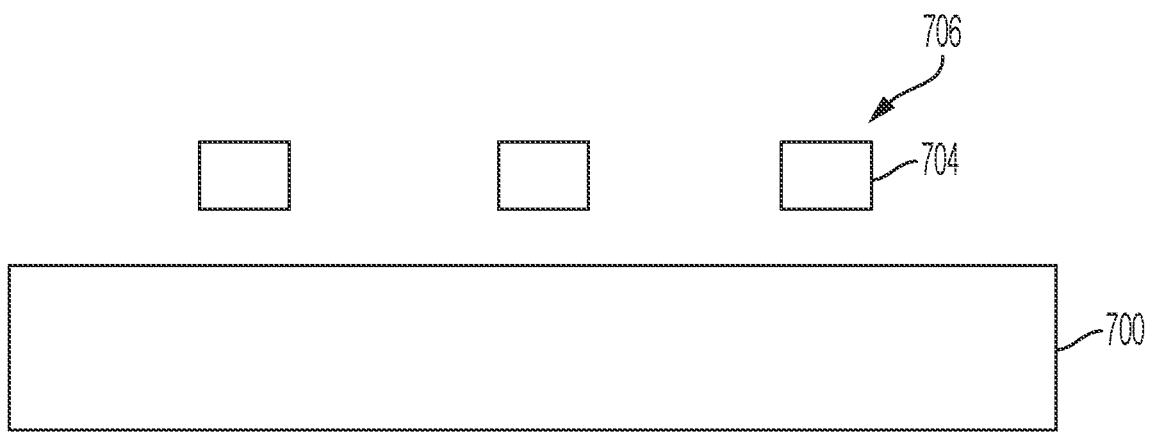

As shown in FIG. 6, the process includes etching the buffer layer 602 and channel layer 604 to create a column 606 extending vertically from the substrate 600. As shown in FIG. 7, the process includes selectively etching the column 706 to remove the buffer layer, leaving the channel layer 704 suspended over the substrate 700.

Figure 8:
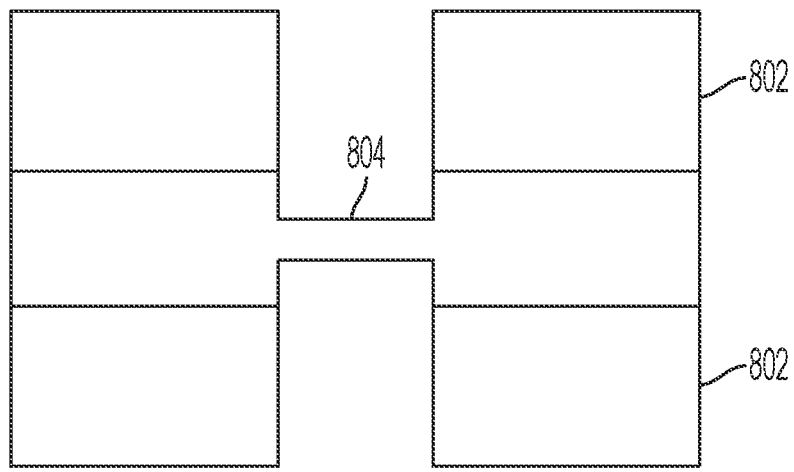

FIG. 8 is a schematic illustration of a top-down view of a suspended channel layer 804. The channel layer 804 is formed on top of the buffer layer 802. The channel layer 804 and buffer layer 802 are then etched in the center region, resulting in a portion of the channel layer 804 being suspended. The channel layer 804 is supported by the buffer layer 802 to the left and right of the suspended portion.

Figure 9:
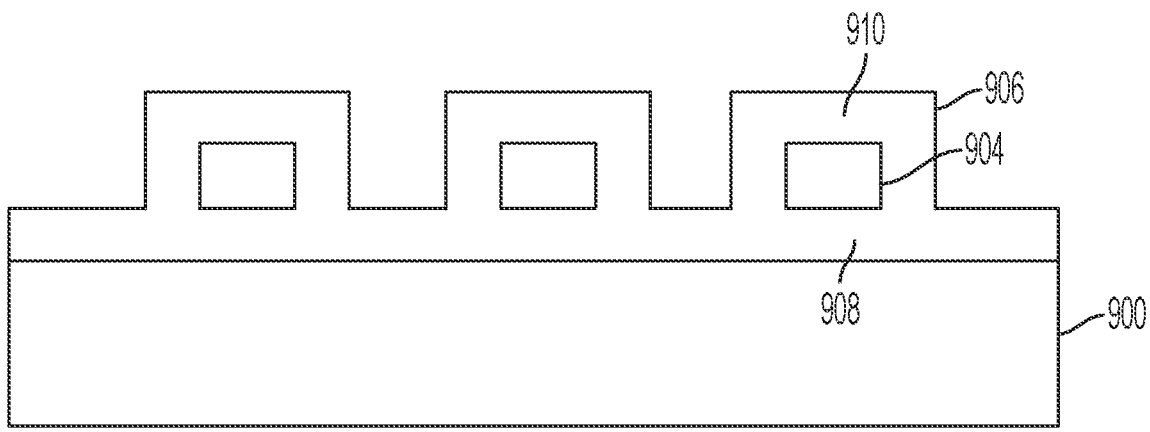

Once the buffer layer has been etched, a superconducting material can be formed on top of the substrate and around the suspended channel layer. FIG. 9 is a schematic illustration of the superconducting material 906 deposited on top of the substrate 900 and the channel layer 904, and also between the substrate 900 and the channel layer 904. The superconducting material 906 may be deposited by atomic layer deposition (ALD). The superconducting material may be, for example, niobium. A first superconducting portion 908 of the superconducting material 906 and a second superconducting portion 910 of the superconducting material 906, in combination with the channel layer 904, form a vertical Josephson junction.

Figure 10:
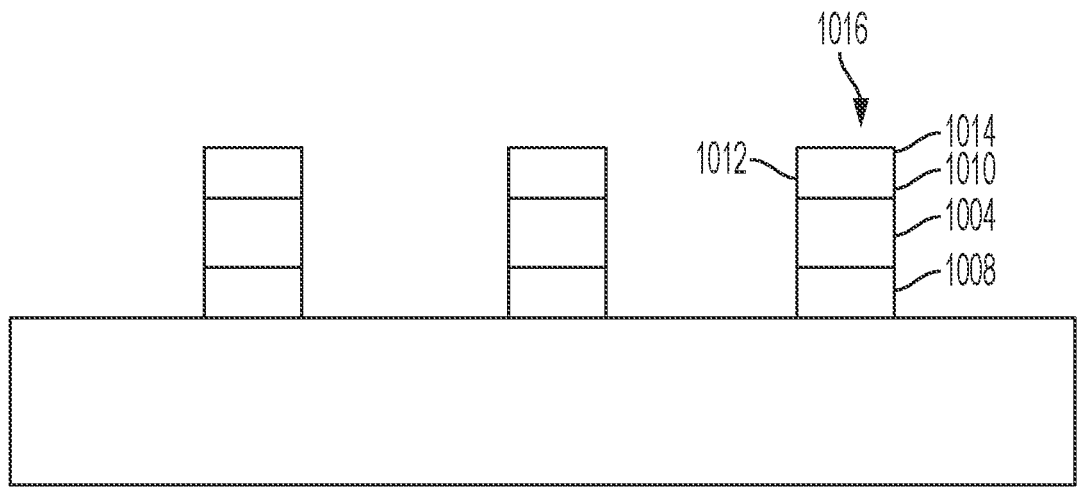

As shown in FIG. 10, the process further includes patterning and etching the superconducting material such that each of the first superconducting portion 1008, the channel layer 1004, and the second superconducting portion 1010 are exposed on opposing side surfaces 1012, 1014 of the vertical Josephson junction 1016.

Figure 11:
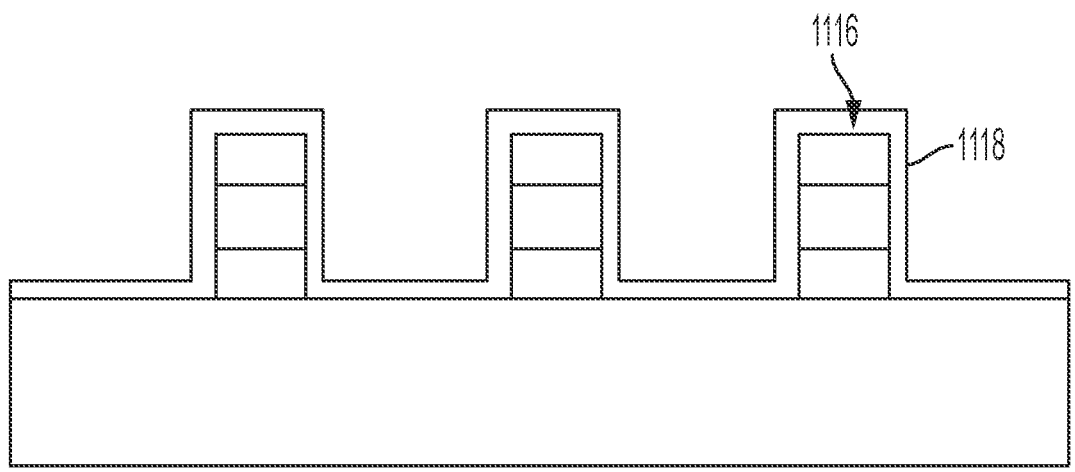
Figure 12:
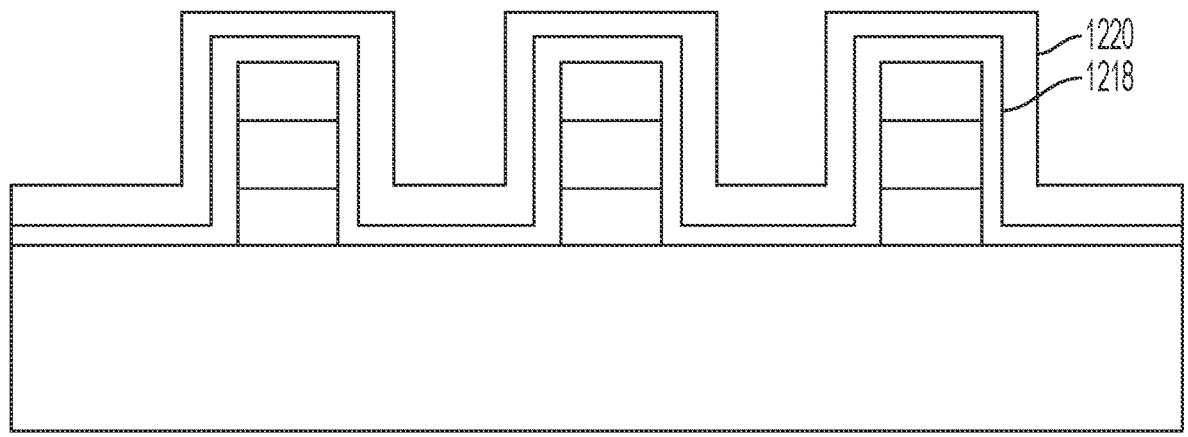

As shown in FIG. 11, the process further includes depositing a gate dielectric layer 1118 on the vertical Josephson junction 1116. As shown in FIG. 12, the process further includes depositing a gate electrically conducting layer 1220 on the gate dielectric layer 1218. The gate electrically conducting layer 1220 may include, for example, a metal. After deposition of the gate electrically conducting layer 1220, the gate electrically conducting 1220 and the gate dielectric layer 1218 may be etched to form a trench exposing a portion of the upper surface of the second superconducting portion 1210, resulting in the structure shown in FIG. 1.

Figure 13:
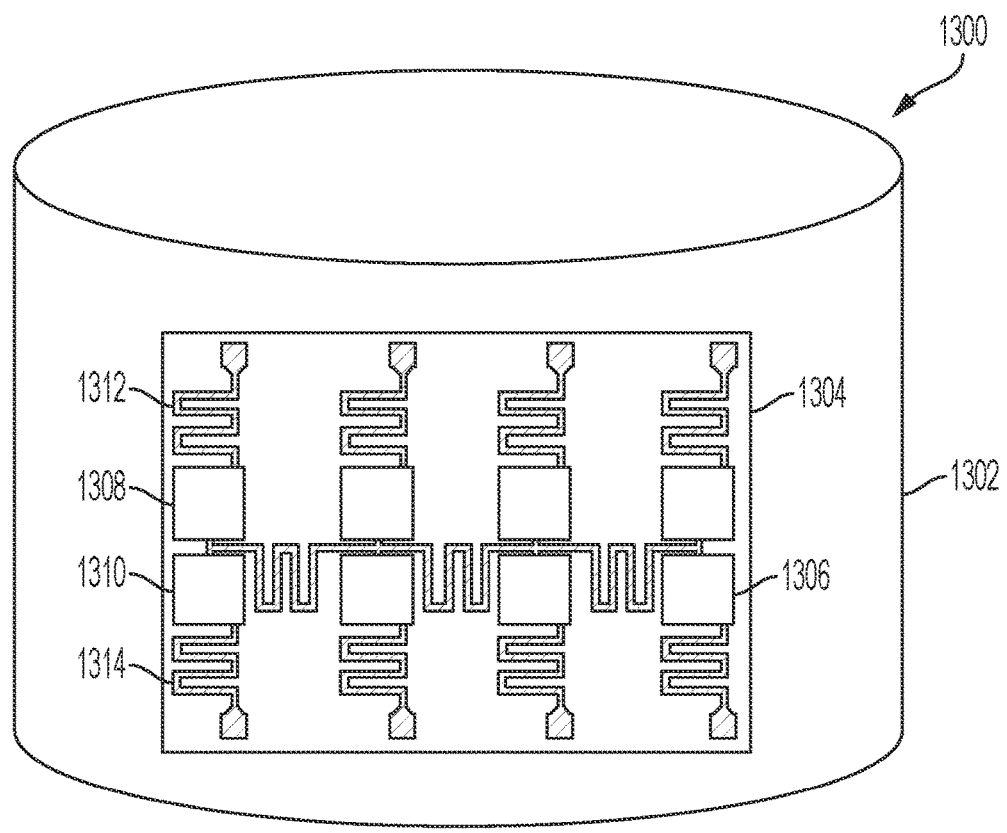
FIG. 13 is a schematic illustration of a quantum computer according to an embodiment of the current invention.

FIG. 13 is a schematic illustration of a quantum computer 1300 according to an embodiment of the current invention. The quantum computer 1300 includes a refrigeration system under vacuum including a containment vessel 1302. The quantum computer 1300 also includes a qubit chip 1304 contained within a refrigerated vacuum environment defined by the containment vessel 1302. The qubit chip 1304 includes a plurality of tunable qubits, 1306, 1308, 1310. The tunable qubits 1306, 1308, 1310 may each include a separate substrate, or may be formed on the qubit chip 1304, with the qubit chip 1304 acting as a shared substrate. The quantum computer 1300 may also include a plurality of electromagnetic waveguides 1312, 1314 arranged within the refrigerated vacuum environment so as to direct electromagnetic energy to and receive electromagnetic energy from at least a selected one of the plurality of tunable qubits 1306, 1308, 1310. The electromagnetic waveguides 1312, 1314 may be formed on the qubit chip 1304, as shown in FIG. 13. One or more of the tunable qubits 1306, 1308, 1310 may have the structure shown in FIG. 3, including a capacitor coupled to a gated Josephson junction, such as the gated Josephson junctions shown in FIGS. 1 and 2.

Figure 14:
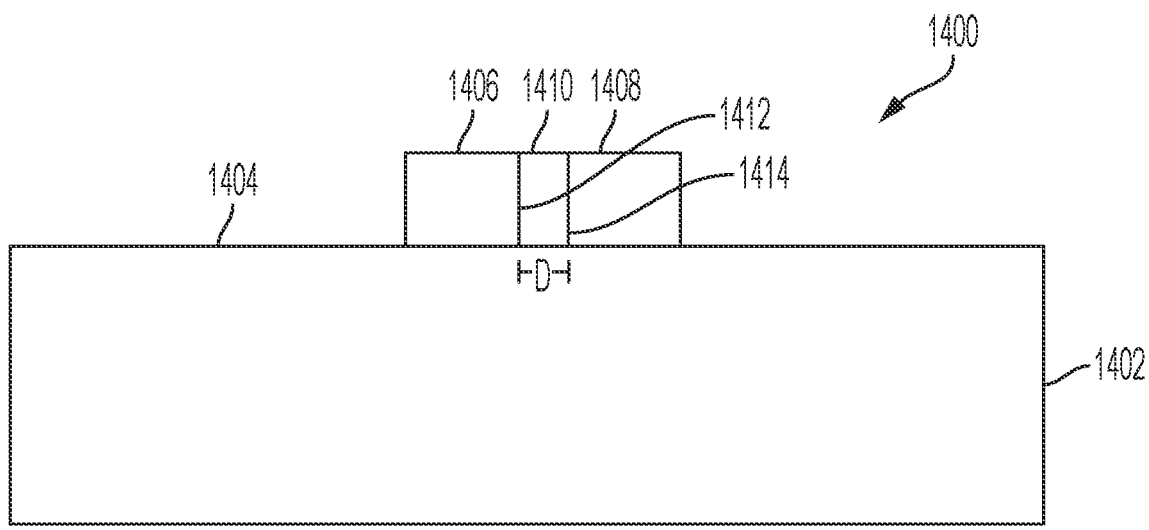
FIG. 14 is a schematic illustration of a horizontal Josephson junction according to an embodiment of the current invention.

FIG. 14 is a schematic illustration of a horizontal Josephson junction 1400 according to an embodiment of the current invention. The horizontal Josephson junction 1400 includes a first superconducting layer 1406 formed on a surface 1404 of a substrate 1402. The horizontal Josephson junction 1400 includes a second superconducting layer 1408 formed on the surface 1404 of the substrate 1402. The second superconducting layer 1408 is spaced apart from the first superconducting layer. The horizontal Josephson junction 1400 further includes a dielectric layer 1410 formed on the surface 1404 of the substrate 1402. The dielectric layer 1410 has a first side surface 1412 in contact with the first superconducting layer 1406 and a second side surface 1414 opposing the first side surface 1410 and in contact with the second superconducting layer 1408. The first side surface 1412 and the second side surface 1414 extend substantially perpendicular to the surface 1404 of the substrate 1402. The first and second superconducting layers 1406, 1408 and the dielectric layer 1410 form a Josephson junction.

According to an embodiment of the invention, a distance D between the first side surface 1412 and the second side surface 1414 is less than 5 nm. The distance D may be, for example, less than or equal to 3 nm, 2 nm, or 1 nm.

Figure 15:
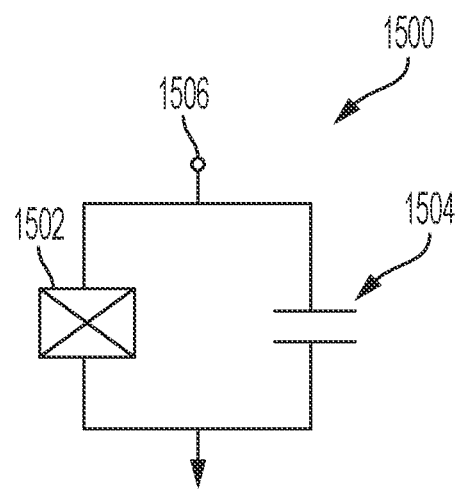
FIG. 15 is a schematic illustration of a qubit according to an embodiment of the current invention.

FIG. 15 is a schematic illustration of a qubit 1500 according to an embodiment of the current invention. The qubit 1500 includes a horizontal Josephson junction 1502 in parallel with a capacitor 1504. The horizontal Josephson junction 1502 may have the structure of the horizontal Josephson 1400 illustrated in FIG. 14. The qubit 1500 may be coupled to a bus or transmission line through the port 1506.

Figure 16:
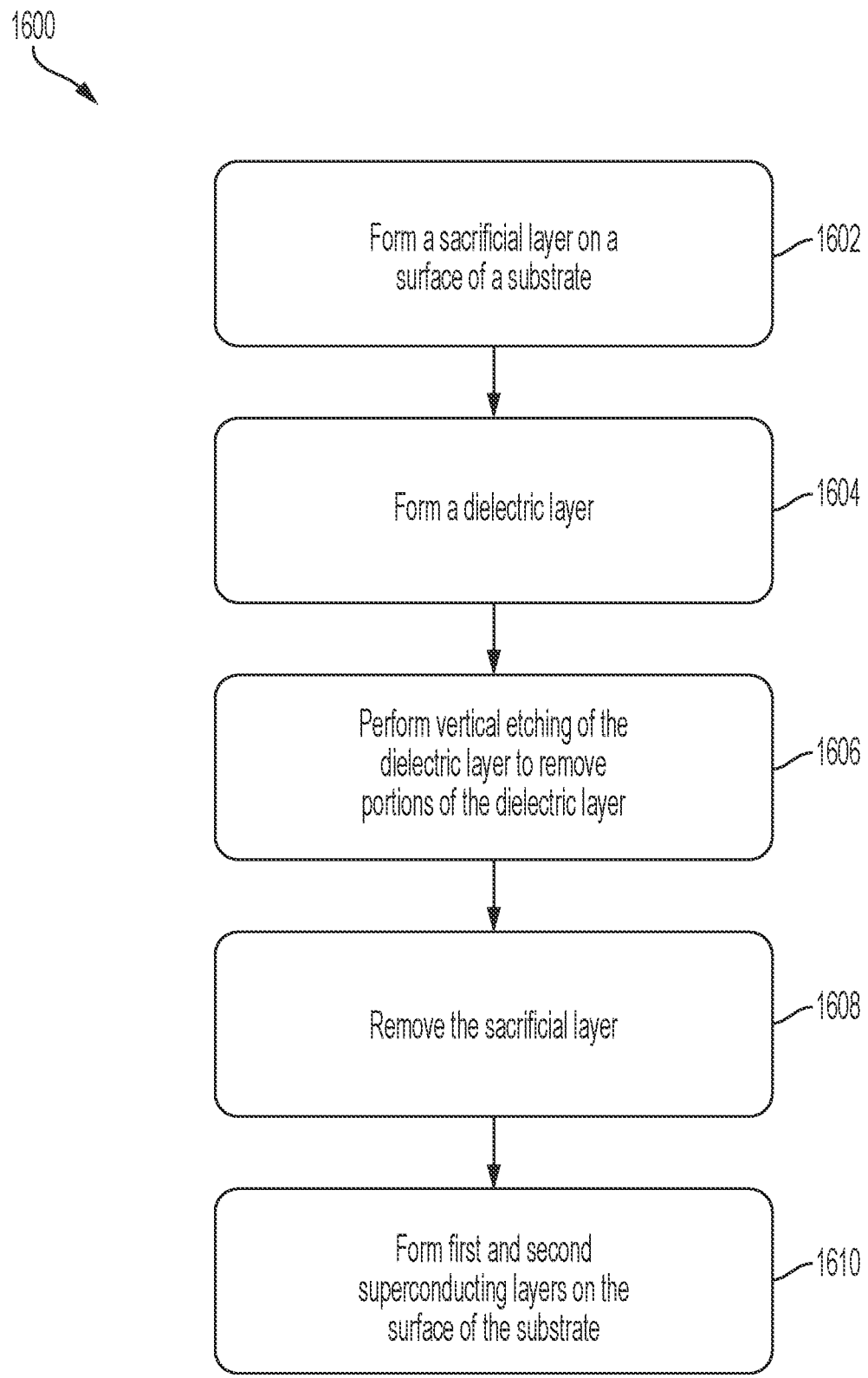
FIG. 16 is a flowchart that illustrates a method of producing a horizontal Josephson junction according to an embodiment of the current invention

FIG. 16 is a flowchart that illustrates a method 1600 of producing a horizontal Josephson junction according to an embodiment of the current invention. The method 1600 includes forming a sacrificial layer on a surface of a substrate 1602, the sacrificial layer having a top surface opposite the surface of the substrate, and opposing first and second side surfaces. The method 1600 further includes forming a dielectric layer 1602. The dielectric layer is formed to have a first portion in contact with the top surface of the sacrificial layer, a second portion in contact with one of the opposing first and second side surfaces of the sacrificial layer, and a third portion in contact with the surface of the substrate. The method 1600 further includes performing vertical etching of the dielectric layer to remove the first portion and the third portion of the dielectric layer 1606. The method 1600 further includes removing the sacrificial layer 1608, such that the second portion of the dielectric layer remains in contact with the surface of the substrate and extends substantially perpendicular to the surface of the substrate. The method 1600 further includes forming first and second superconducting layers on the surface of the substrate 1610, the first and second superconducting layers being in contact with opposing sides of the second portion of the dielectric layer. The first and second superconducting layers and the second portion of the dielectric layer form a horizontal Josephson junction.

According to an embodiment of the present invention, a distance between the opposing sides of the second portion of the dielectric layer is less than 5 nm. For example, performing vertical etching of the dielectric layer to remove the first portion and the third portion of the dielectric layer 1606 may result in said second portion of the dielectric layer having a width that is less than 5 nm. Performing vertical etching of the dielectric layer to remove the first portion and the third portion of the dielectric layer 1606 may also include removing a portion of the second portion of the dielectric layer to reduce a width of the second portion of the dielectric layer.

According to an embodiment of the present invention, the method further includes coupling the horizontal Josephson junction to a capacitor to form at qubit, such as the qubit illustrated in FIG. 15. A key parameter for the formation of qubits is the controllability of the frequency at which the qubit operates. This, in turn, is determined by the thickness of the dielectric layer that forms the Josephson junction. This approach of employing a sidewall spacer-like method gives a more reproducible dielectric thickness, especially at very small dimensions, for example, less than 5 nm.

FIGS. 17-23 are schematic illustrations of a process that can be used to form a horizontal Josephson junction according to an embodiment of the current invention. In the description below, reference is made to a single horizontal Josephson junction, and formation thereof. However, a plurality of horizontal Josephson junctions may be fabricated at once, as illustrated in the drawings. In FIGS. 17-23, like reference numerals refer to like features.

Figure 17:
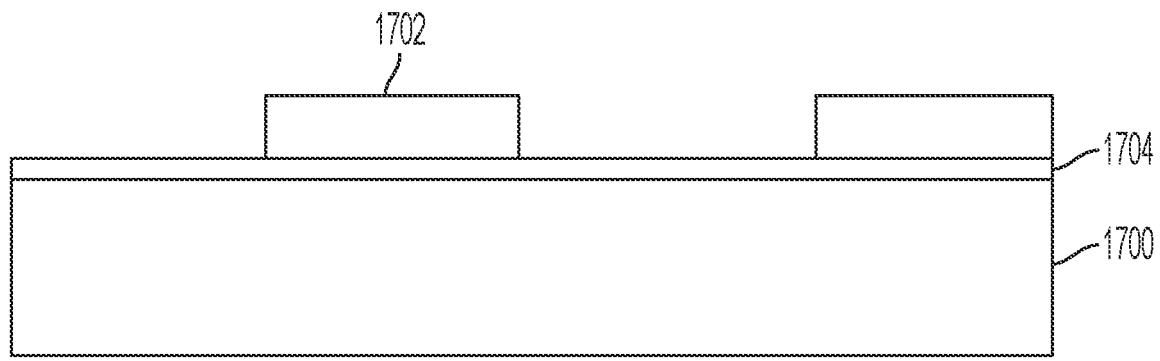
FIGS. 17-23 are schematic illustrations of a process that can be used to form a horizontal Josephson junction according to an embodiment of the current invention.

To produce a horizontal Josephson junction according to an embodiment of the current invention, a sacrificial layer 1702 is deposited on a substrate 1700 and patterned to form a spacer, as shown in FIG. 17. The substrate 1700 may include an oxide layer 1704, as shown in FIG. 17. Alternatively, the substrate 1700 may not include an oxide layer.

Figure 18:
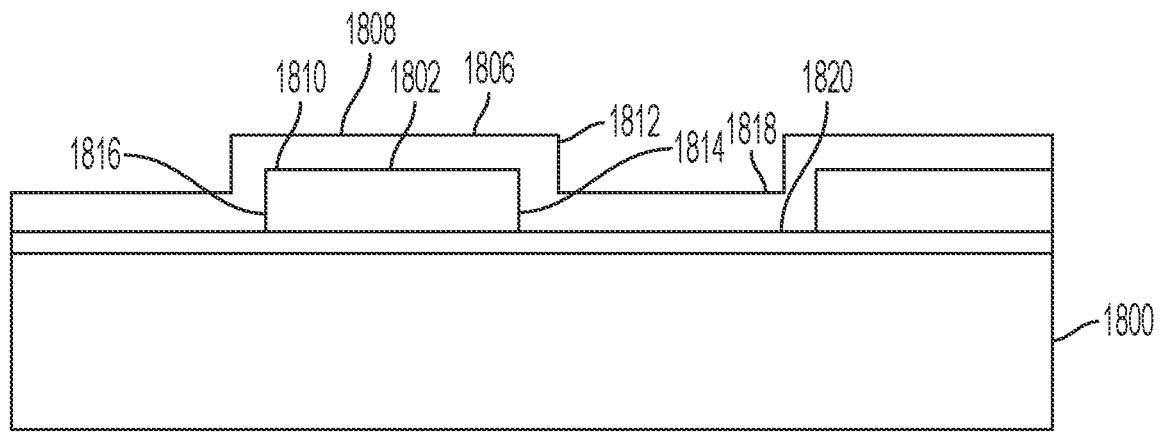

As shown in FIG. 18, the process further includes depositing a dielectric layer 1806 on top of the spacer 1802 and the substrate 1800. The dielectric layer 1806 includes a first portion 1808 in contact with the top surface 1810 of the sacrificial layer 1802, a second portion 1812 in contact with one of the opposing first and second side surfaces 1814, 1816 of the sacrificial layer 1802, and a third portion 1818 in contact with the surface 1820 of the substrate 1800.

Figure 19:
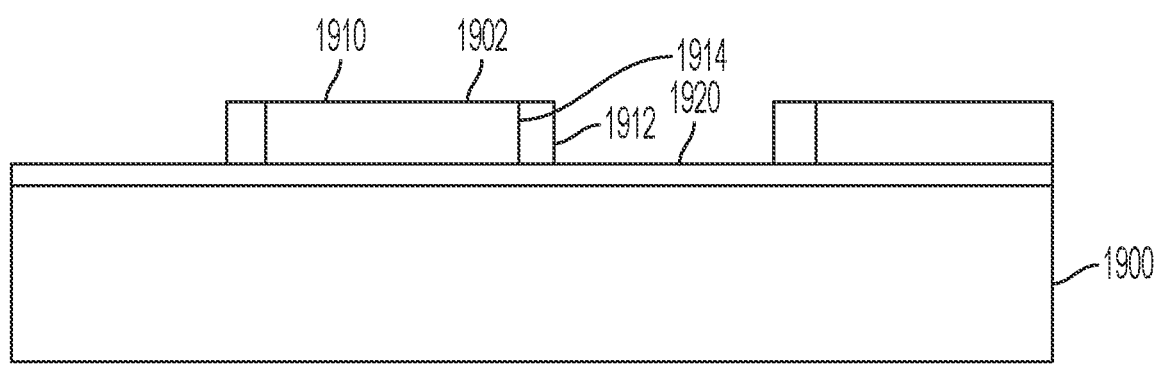

As shown in FIG. 19, the process further includes removing the first portion of the dielectric layer in contact with the top surface 1910 of the sacrificial layer 1902, and the third portion of the dielectric layer in contact with the surface 1920 of the substrate 1900 by vertical etching. The vertical etching leaves the second portion 1912 of the dielectric layer in contact with the side surface 1914 of the sacrificial layer 1902. The vertical etching may or may not reduce the width of the second portion 1912 of the dielectric layer, depending on the vertical method used to remove the first portion and the third portion of the dielectric layer. If a reactive ion etching (RIE) approach is used, then there may be a slight (and controllable) loss of the second portion. If chemical mechanical polishing (CMP) is used, then the second portion will remain unaltered.

Figure 20:
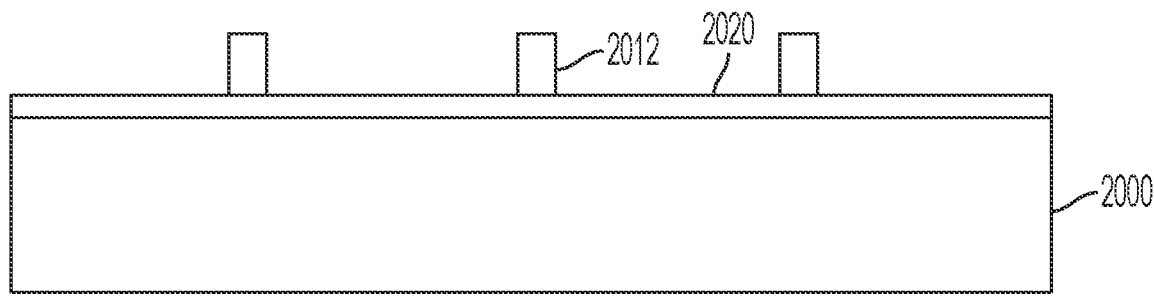

As shown in FIG. 20, the process further includes removing the sacrificial layer, leaving the second portion 1912 of the dielectric layer as a freestanding structure extending substantially perpendicular to the surface 2020 of the substrate 2000. Selective chemical etching may be used to remove the sacrificial layer. The amount of the second portion 1912 that is removed depends on the selectivity of the etchant. As an example, if the sacrificial layer is silicon nitride and the dielectric layer is silicon dioxide, then the selectivity can range from 100 to 1000×.

Figure 21:
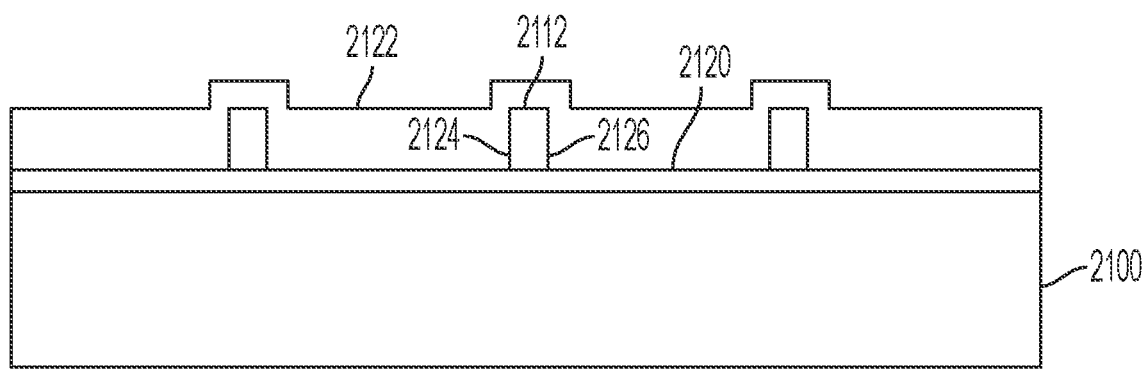

As shown in FIG. 21, the process further includes depositing a superconducting material 2122 on the second portion 2112 of the dielectric layer and on the surface 2120 of the substrate 2100. The superconducting material 2122 contacts the opposing side surfaces 2124, 2126 of the second portion 2112.

Figure 22:
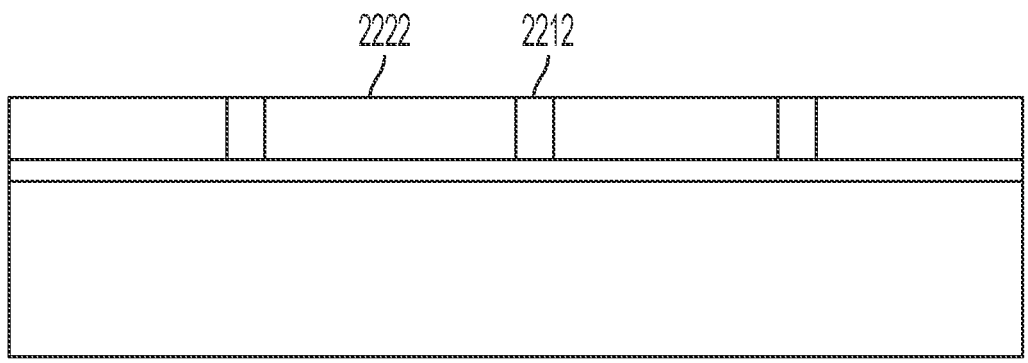

As shown in FIG. 22, the process further includes removing the portion of the superconducting material 2122 covering the top surface of the second portion 2212. The portion of the superconducting material 2122 can be removed using chemical-mechanical polishing, for example.

Figure 23:
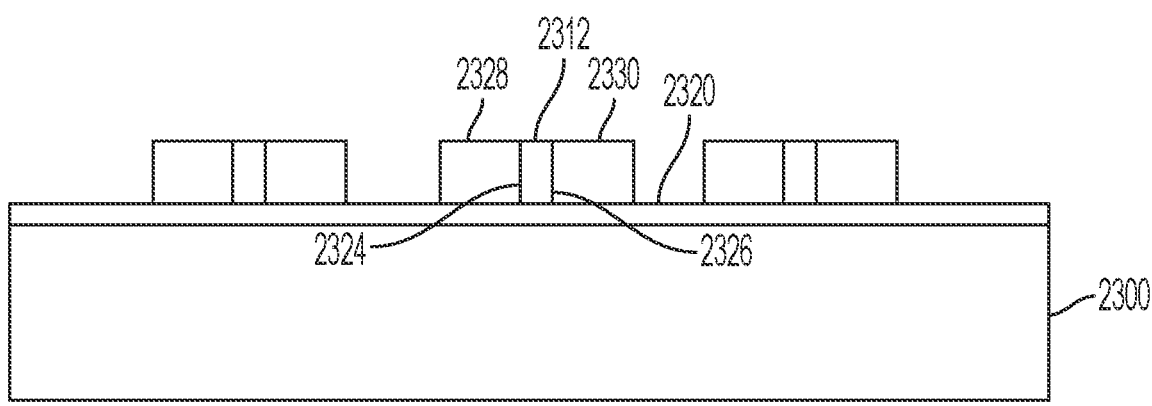

As shown in FIG. 23, the process further includes removing additional portions of the superconducting material, resulting in a first superconducting layer 2328 in contact with the first side surface 2324 of the second portion 2312 of the dielectric layer, and a second superconducting layer 2330 in contact with the second side surface 2326 of the second portion 2312 of the dielectric layer. The first side surface 2324 and the second side surface 2326 extend substantially perpendicular to the surface 2320 of the substrate 2300. The first and second superconducting layers 2328, 2330 and the second portion 2312 of the dielectric layer form a Josephson junction.

According to an embodiment of the current invention, a quantum computer includes a refrigeration system under vacuum including a containment vessel. The quantum computer also includes a qubit chip contained within a refrigerated vacuum environment defined by the containment vessel. The qubit chip includes a plurality of qubits, each including a horizontal Josephson junction coupled to a capacitor. The tunable qubits may each include a separate substrate, or may be formed on the qubit chip, with the qubit chip acting as a shared substrate. The quantum computer may also include a plurality of electromagnetic waveguides arranged within the refrigerated vacuum environment so as to direct electromagnetic energy to and receive electromagnetic energy from at least a selected one of the plurality of tunable qubits. The electromagnetic waveguides may be formed on the qubit chip.

For example, the tunable qubits 1306, 1308, 1310 included in the quantum computer 1300 illustrated in FIG. 13 may be replaced by qubits that include a horizontal Josephson junction. The qubits may have the structure illustrated in FIG. 15, and may include a horizontal Josephson junction, such as the horizontal Josephson junction illustrated in FIG. 14.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A gated Josephson junction, comprising:
   a first superconducting layer formed on a surface of a substrate;
   a semiconducting layer formed on a surface of the first superconducting layer that is opposite to the surface of the substrate;
   a second superconducting layer formed on a surface of the semiconducting layer that is opposite to the surface of the first superconducting layer; and
   a dielectric layer formed on the surface of the substrate, wherein the dielectric layer is in contact with respective first side surfaces of the first superconducting layer, the semiconducting layer, and the second superconducting layer, and wherein the dielectric layer is in contact with respective second side surfaces of the first superconducting layer, the semiconducting layer, and the second superconducting layer opposing the respective first side surfaces, wherein the respective first side surfaces and the respective second side surfaces extend substantially perpendicular to the surface of the substrate.

2. The gated Josephson junction of claim 1, wherein the dielectric layer is in contact with a surface of the second superconducting layer opposite the surface of the semiconducting layer.

3. The gated Josephson junction of claim 2, further comprising a conducting layer in contact with a surface of the dielectric layer that is opposite to the first side surfaces and the second side surfaces of the first superconducting layer, the semiconducting layer, and the second superconducting layer.

4. The gated Josephson junction of claim 3, further comprising a trench in the conducting layer and the dielectric layer that exposes a portion of the surface of the second superconducting layer opposite the surface of the semiconducting layer.

5. A method of forming a horizontal Josephson junction, comprising:
   forming a sacrificial layer on a surface of a substrate, said sacrificial layer having a top surface opposite said surface of said substrate, and opposing first and second side surfaces;
   forming a dielectric layer, said dielectric layer having a first portion in contact with said top surface of said sacrificial layer, a second portion in contact with one of said opposing first and second side surfaces of said sacrificial layer, and a third portion in contact with said surface of said substrate;
   performing vertical etching of said dielectric layer to remove said first portion and said third portion of said dielectric layer;
   removing said sacrificial layer, such that said second portion of said dielectric layer remains in contact with said surface of said substrate and extends substantially perpendicular to said surface of said substrate; and
   forming first and second superconducting layers on said surface of said substrate, said first and second superconducting layers being in contact with opposing sides of said second portion of said dielectric layer,
   wherein said first and second superconducting layers and said second portion of said dielectric layer form a horizontal Josephson junction.

6. The method according to claim 5, wherein a distance between said opposing sides of said second portion of said dielectric layer is less than 5 nm.

7. The method according to claim 6, wherein a distance between said opposing sides of said second portion of said dieletric layer is less than 1 nm.

8. The method according to claim 5, further comprising:
   coupling said horizontal Josephson junction to a capacitor to form a qubit.

* * * * *